(12) United States Patent
Raghavan et al.

(10) Patent No.: US 6,697,661 B2
(45) Date of Patent: Feb. 24, 2004

(54) APPARATUS, SYSTEM AND METHOD FOR CALIBRATING MAGNETIC RESONANCE RECEIVER COILS

(75) Inventors: Raghu Raghavan, Baltimore, MD (US); Timothy Poston, Singapore (SG); Raju R. Viswanathan, Towson, MD (US)

(73) Assignee: Image-Guided Neurologics, Inc., Melbourne, FL (US)

( * ) Notice: Subject to any disclaimer, the term of this patent is extended or adjusted under 35 U.S.C. 154(b) by 201 days.

(21) Appl. No.: 10/043,323

(22) Filed: Jan. 14, 2002

(65) Prior Publication Data

US 2003/0135109 A1 Jul. 17, 2003

(51) Int. Cl.$^7$ ............................................. A61B 5/055
(52) U.S. Cl. ................... 600/410; 600/422; 600/423; 324/318; 324/322; 324/309
(58) Field of Search ........................... 600/410, 421, 600/422, 423, 407, 408, 411; 128/920, 923, 924, 925; 324/307, 309, 316, 318, 322, 312, 314

(56) References Cited

U.S. PATENT DOCUMENTS

| | | | | |
|---|---|---|---|---|
| 4,284,950 A | * | 8/1981 | Burl et al. ............... | 324/320 |
| 4,682,112 A | * | 7/1987 | Beer ......................... | 324/322 |
| 6,211,675 B1 | * | 4/2001 | Ganin et al. ............. | 324/318 |

* cited by examiner

Primary Examiner—Eleni Mantis Mercader
(74) Attorney, Agent, or Firm—Piper Rudnick LLP; Steven B. Kelber

(57) ABSTRACT

An apparatus, system and method for calibrating a movable receiver coil with spatially varying signal reception profile in a magnetic resonance imaging environment is described. The method of the invention calibrates the movable receiver coil with spatially varying signal reception profile by dividing the receiver coil into parts and determining electromagnetic interactions of the parts in the environment. The method further includes (1) estimating orientation and position information corresponding to the receiver coil and (2) associating electromagnetic interaction data with records such as (a) responses of the receiver coil in various tissue environments to emissions caused by stimuli from external magnetic resonance coils, (b) high-resolution external receiver coil records of emissions from same environments, and (c) measurements of self-interactions and mutual interactions among the parts of the receiver coil.

25 Claims, 3 Drawing Sheets

APPARATUS, SYSTEM AND METHOD FOR CALIBRATING MAGNETIC RESONANCE RECEIVER COILS

BACKGROUND OF THE INVENTION

1. Field of the Invention

This invention generally relates to magnetic resonance imaging ("MRI") and, more specifically, to an apparatus, system and method for calibrating magnetic resonance receiver coils.

2. Description of Related Art

Magnetic resonance imaging is an imaging technique used primarily in medical settings to produce high quality images of the inside of a natural organism (such as within a human body). MRI is based on the principles of nuclear magnetic resonance, i.e., a spectroscopic technique used to obtain microscopic chemical and physical information about the molecules. In particular, MRI is based on the absorption and emission of energy of the molecules in the radio frequency ("RF") range of the electromagnetic spectrum. MRI involves the use of a number of coils for generating and detecting magnetic fields.

Conventionally, magnetic resonance coils are used externally to the body to generate magnetic resonance images, while magnetic resonance microcoils may be mounted at the tip of a catheter or other insertion devices used to probe the interior of the body. With magnetic resonance coils, which produce static magnetic fields, a standard design goal is that the strength of the coils' components in the z-direction (typically the direction parallel to the axis of the main outer coils) should be as uniform as possible over the region to be scanned. Transmit coils emit an RF pulse to which molecules in the body respond. The response is detected by a receiver coil. In cases where the transmit coil is located externally to the subject to be imaged and the receiver coil is located internally (within the subject to be imaged), the signal strength of the response at the receiver coil diminishes based on its distance from the responding molecule. As such, a good signal-to-noise ratio at the receiver coil requires either that the response be strong at the molecule, or that the receiver coil be close to the responding molecule.

A strong response at the molecule requires that it possesses a strong intrinsic magnetic moment, which is in practice a severe limitation on the types of molecules which can be usefully imaged. One way of overcoming this limitation is to make the receiver coil a microcoil in the order of millimeters or less in diameter, to be carried by a catheter or other physically invasive device. Designers of such microcoils have sought to achieve high gains and uniform responses over wide fields of view. See, for example, "A Device for High Gain and Uniformly Localized Magnetic Resonance Imaging," U.S. application Ser. No. 09/532,145 now U.S. Pat. No. 6,487,437; "A Microcoil Device for Local, Wide Field of View and Large Gain Magnetic Resonance Imaging," U.S. application Ser. No. 09/532,667 now U.S. Pat. No. 6,560,475; and "A Microcoil Device with a Forward Field of View for Large Gain Magnetic Resonance Imaging," U.S. application Ser. No. 09/532,037 now U.S. Pat. No. 6,587,706, all of which were filed Mar. 21, 2000 and are hereby incorporated by reference.

There are many complications, however, involved with the use of small inserted microcoils. Microcoils have highly spatially varying signal reception profiles that fall off sharply with increasing distance. Microcoils have signal reception profiles that are dependent on their orientations with respect to a magnetic resonance scanner's static magnetic field. Microcoils' electrical properties (inductance, capacitance, etc.) in a tissue are different from coils' electrical properties in vacuum. Upon RF excitation, precessing atomic nuclei (typically protons in hydrogen atoms of the molecules) in the tissue emit decaying RF radiation, which induce currents both in the receiver microcoil and in the tissue. The currents in the tissue introduce coupling effects between the receiver microcoil and the tissue producing resistive, inductive and capacitive consequences. The complications are not uniform, e.g., the effects differ in areas such as brain tissues, cerebrospinal fluid, blood, etc. In other words, the signal reception field of a microcoil is affected by its surrounding medium and, as a result, the microcoil cannot be calibrated simply by tests in a single known environment.

In one method for calibrating microcoils which yields a uniform intensity scale over the extent of an image, the reconstructed signal intensity in an image acquired by the microcoil is renormalized by dividing it by the theoretically expected reception field profile (as dictated by the principle of reciprocity in electromagnetism). A drawback of this method is that the orientation of the microcoil with respect to the magnetic resonance scanner's static magnetic field must be known. Moreover, the changes in the signal receptivity due to the coil's dielectric surroundings are ignored. Thus, although the use of microcoils in MRI devices has advanced in recent years, it is still a growing field with a need for an apparatus, system and method for calibrating magnetic resonance microcoils.

SUMMARY OF THE INVENTION

Exemplary embodiments of the invention include apparatuses, systems and methods for calibrating a movable receiver coil (the terms movable receiver coil and receiver coil are used interchangeably with microcoil in the present invention) in a dielectric environment. A method of the invention includes dividing the receiver coil into parts, determining electromagnetic interactions of the parts in the environment, and correlating the electromagnetic interactions of the parts so as to characterize the environment. The method of the invention further includes (1) estimating orientation and position information corresponding to the receiver coil, and (2) associating the correlated electromagnetic interactions data with records such as (a) responses of the receiver coil in various tissue environments to emissions caused by stimuli from external magnetic resonance coils, (b) high-resolution external receiver coil records of emissions from same environments, and (c) measures of self-interactions and mutual interactions among the parts of the receiver coil.

The parts of the receiver coil may be connected in series or parallel. The measures of self-interactions and mutual interactions among the parts may include records of currents flowing in the parts when each of the parts is exposed to a predetermined voltage or when a whole of the receiver coil is exposed to one or more predetermined magnetic pulses.

The method of the invention further comprises constructing a cost function using the associated records and a correction function in each tissue environment, and combining the associated records with the cost function to train an automated system to associate any set of interaction records with a scheme of modifications to functions constructed by the receiver coil. The modifications include spatially-varying functions that are added to a spatially-varying multiplier so as to convert constructed image intensities to attributed image activities. The automated system may be an artificial neural network, a genetic algorithm, a statistical least-squares fit computation, or any known or foreseeable predictors.

BRIEF DESCRIPTION OF THE DRAWINGS

The accompanying drawings, which are incorporated in and constitute a part of the specification, illustrate exemplary embodiments of the invention and, together with the detailed description of the invention, explain various aspects and principles of the invention. In the drawings.

DETAILED DESCRIPTION OF THE INVENTION

Figure 1:
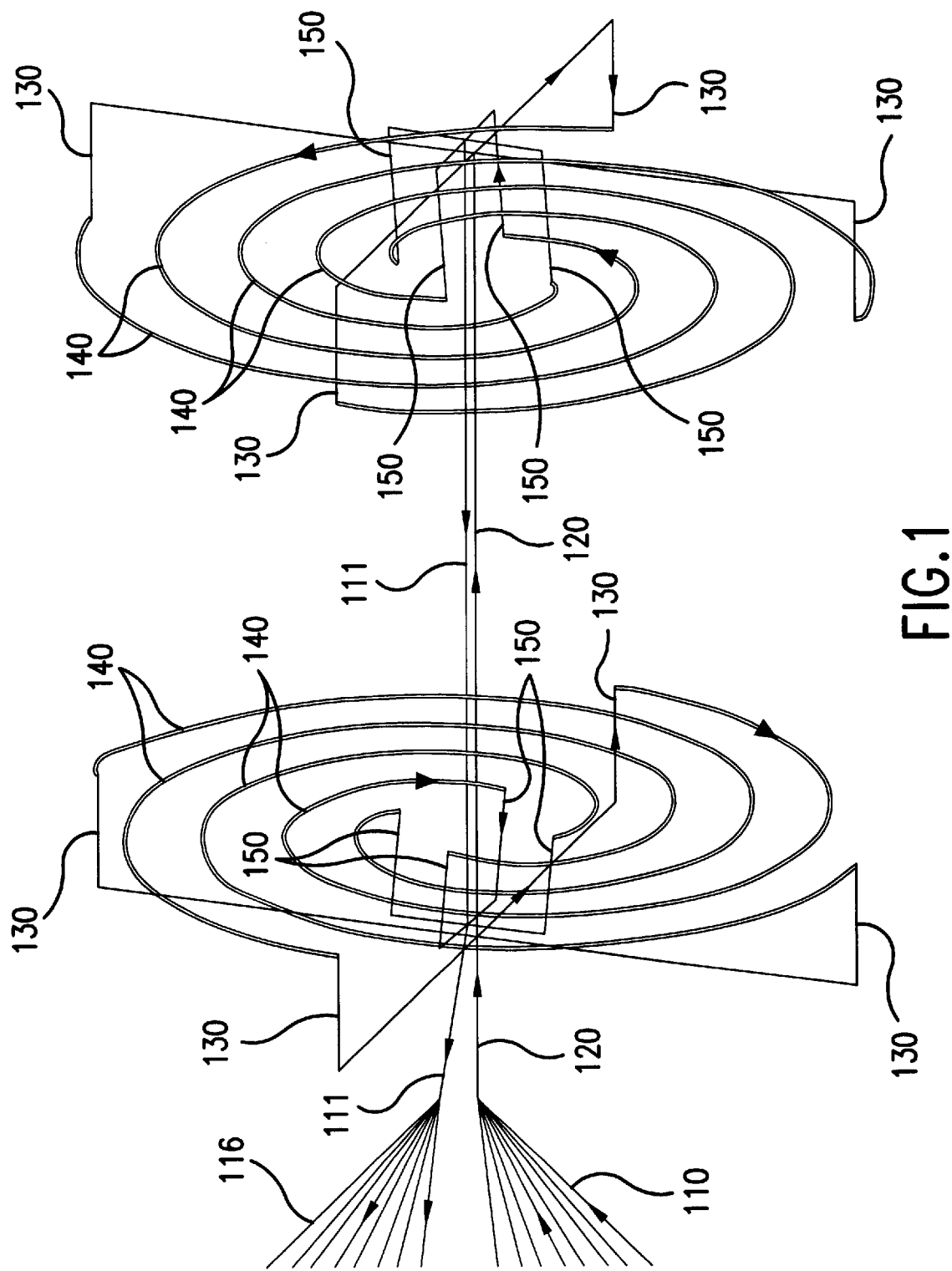
FIG. 1 is an illustration of a receiver coil design, subdivided into parts, in accordance with an exemplary embodiment of the invention.

The detailed description of the invention refers to the following computations and accompanying drawings that illustrate exemplary embodiments of the invention. These embodiments are described in sufficient detail to allow those in the art to practice the invention, and it is understood that other embodiments may be utilized and that structural, configurational, logical, physical, architectural and/or electrical changes may be made to the exemplary embodiments without departing from the spirit and scope of the invention. Therefore, the following detailed description is not meant to limit the invention. Rather, the scope of the invention is defined by the appended claims.

Coil design is often addressed in terms of its magnetic field. The sensitivity or gain of a coil is proportional to the component of the magnetic field that is transverse to the main field of an MRI system, produced by a unit current flowing through the coil. Letting the magnetic resonance scanner's static magnetic field point in the z-direction (in vacuum or air), the magnetic field B in a specific region surrounding a coil C may be computed using the Biot-Savart law as follows:

$$B = \mu_0 \int_c \frac{dl \times r}{|r|^3} \qquad (1)$$

where $\mu_0$ is the magnetic permeability of free space, dl is the length element along the coil, and r is the distance vector from the length element to a point (x,y,z), with the integral taken over the length of the coil C. The voltage across the ends of the entire coil is $$V(t) = \int_R \rho(x, y, z, t) dv = \gamma \int_R B_\perp^C(x, y, z) \sigma(x, y, z, t) dv \qquad (2)$$

with the integral taken over a region R containing the molecules which produce a signal contribution ρ. The signal contribution ρ from location (x,y,z) is observed as $$\rho(x,y,z,t) = \gamma \beta(x,y,z) \sigma(x,y,z,t) \qquad (3)$$

where $\beta(x,y,z) = B_\perp^C g(x,y,z) = B_\perp^C(x,y,z) g(x,y,z)$, σ(x,y,z,t) is a local-physics-dependent emitted signal strength, and $B_\perp^C$ (x,y,z) is the (x,y)-component of equation (1) computed for the microcoil C in vacuum, which is a known function. Function g(x,y,z) is a correction function that is unity in the absence of electromagnetic interactions with the tissue.

In addition to coil geometry, $B_\perp^C$ depends on an orientation of the coil with respect to a scanner's static magnetic field. If this orientation is available, then $B_\perp^C$ may be computed everywhere within the region of interest by a suitable projection of the magnetic field computed from equation (1). However, this orientation is in general not directly available. Thus, the following process is employed to estimate the orientation of the coil with respect to the scanner.

Using a well-defined phantom object such as an appropriate gel, magnetic resonance images are acquired for a variety of relative orientations between the coil and the scanner, and for a variety of image slice orientations and corresponding locations of axial point (where the image plane intersects the coil/catheter axis). In each image slice, the invention introduces a local patch around a pixel in the acquired image within which the invention estimates a noise level as the summed magnitude of a suitably high-pass filtered version of the signal intensities in the patch. The invention then defines a noise fraction associated with that pixel as the ratio of the noise level to the total signal intensity in the patch. In other words, the process of the invention obtains a noise fraction image, which can be used to separate relatively high-noise regions from relatively low-noise regions by suitable thresholding, for each set of distinct coil orientations and image slice orientations together with corresponding axial point locations.

This set of noise fraction images and corresponding known orientations and axial points may be used (e.g., after a suitable Fourier transform of the noise fraction images) as a training set for any of a variety of "function estimation" methods such as neural networks, genetic algorithms, and other interpolation methods known or foreseeable to one of ordinary skill in the art. The training set serves to functionally relate the noise fraction image to coil orientation, slice orientation and axial point location. For example, a neural network may be trained using the noise fraction images and associated known coil and image slice orientations, in order to produce an estimated coil orientation and axial point location when presented with a noise fraction image (of known slice orientation since it is scanner-derived) that is not part of the training set.

When an image is acquired by a magnetic resonance scanner with the microcoil in an unknown orientation within the subject being imaged, an associated $B_\perp^C$ may be evaluated as follows. Given the magnetic field B computed from equation (1) everywhere on a fine grid of points within a volume of interest (based on the orientation of the coil and an image slice axial point location obtained from the function estimation method applied to the acquired image, together with a known image slice orientation), a corresponding slice of vector B values within the volume of interest may be extracted and projected onto a plane perpendicular to the direction of the scanner's static magnetic field to get a corresponding set of values for $B_\perp^C$ everywhere within the image slice. The coil orientation and image slice axial point location thus deduced may be represented as a rigid transformation M, which may be represented as a 4×4 matrix.

In the case when the coils are flexible, a non-rigid class of transformations may be used to describe the geometry. That is, in addition to translation and orientation information, other parameters are necessary to specify the geometry. For example, given a noise fraction image, the function estimation method may be extended and the training method augmented to include the estimation of these other parameters. Even though only the case of rigid geometries is discussed below, it is noted that the method of the invention may be extended to the flexible case as well.

Referring to equation (2), signal V(t) of a coil is not a computation of an image but is a voltage measurement that depends linearly on signal-emission field σ(x,y,z,t), for a given set S of gradient magnetic field strengths and pulses created by external coils. The set S is designed to allow construction of a linear operator $I_S$ from a vector space U of possible output time courses V(t) to a space W of possible functions w(x,y,z), which is a three-dimensional image in the present application. The invention produces a w(x,y,z) correlated with physico-chemical properties at (x,y,z), instead of the emitted signal strength σ(x,y,z,t) that is driven differently at different places by the external coils. (In particular, the different timing of the response is used to separate the contribution from different places.)

A design ideal in MRI is that for an image function $I_S(V)$ that is computed from the coil signal function V(t), the value of w at a particular location (x,y,z) should depend on σ(x,y,z,t) for that location (x,y,z) (and not on the values of σ elsewhere). Assuming as an approximation that this locality condition holds true, it follows by the linearity of equation (2) and $I_S$ that the correction function g(x,y,z) becomes an image multiplier. That is, if w(x,y,z) is the image that would be produced for a microcoil C with sensitivity $B_\perp^C$ derived from the vacuum equation (1), and w'(x,y,z) is the image produced for C with the modified sensitivity β, then $$w'(x,y,z)=w(x,y,z)g(x,y,z) \qquad (4)$$

The time-independent replacement of $B_\perp^C$ by $\beta=B_\perp^C g$, in a particular capacitance/inductance environment, is essential to the existence of a common multiplier for all images. Such commonality ensures that, for example, changes in the brain such as those imaged by functional MRI, which do not modify capacitance or inductance, would involve the same image multiplier g(x,y,z) in equation (4) (for the same microcoil position). A preferred embodiment of the invention uses this form of modification, rather than a distortion to, e.g., w''=w(ξ(x,y,z), η(x,y,z), ζ(x,y,z)) where (ξ,η,ζ) are distorted-image coordinates. The invention uses equation (4) for image modification, but it is foreseeable to one of ordinary skill in the art to adapt this to other forms of image modification that may arise from the physical surroundings.

For different positions P of the microcoil C relative to the surrounding body, the image multiplier g(x,y,z) generally will be different. A feature of the invention is to make the differences in the image multiplier quantitatively discoverable, so as to compensate for it.

In coordinates (X,Y,Z) carried with the microcoil C, all possible smooth g may be expressed as a weighted sum of a set of functions such as the collection of all possible $r^\alpha Z^\beta \text{Im}[(X+iY)^\gamma]$, where $r=\sqrt{X^2+Y^2}$ and α, β, γ are non-negative integers. When the weights for each image multiplier g are unique, the set of functions is a basis. It is convenient but not critical in the invention to use a set having this property. Labeling these functions as $g_m(X,Y,Z)$, m=1, ..., ∞ in a way so that the later weights a tend to be smaller, this results in $$g(X,Y,Z) = \sum_{m=0}^{\infty} a_m g_m(X,Y,Z). \qquad (5)$$

Other function sets may be used so long as they are convenient for a particular design of the microcoil C. (The set described above is particularly appropriate for a coil which approximates rotational symmetry about the Z-axis.)

The preferred embodiment of the invention uses the above set of basis functions, but other sets of algebraic functions, spherical harmonics multiplied by powers of $\sqrt{X^2+Y^2+Z^2}$, or wavelet functions or other convenient sets may be used by one skilled in the art.

The implementation in each case uses a finite subset $b_1, \ldots, b_N$, for some N, of a theoretically infinite set. The trade-off is between the desirable smallness of N (less computation) and the degree of correction that can be achieved (higher N and more computation). It is suggested that one experimentally selects a function set and a cut-off N which robustly embodies a desired degree of correction.

It should be noted that the unknown capacitance and inductance properties of the medium modify not only $B_\perp$, but also the self-interactions of the coil causing uncertainties and limiting the amount of correction available. To overcome this, the invention uses measured effects of inhomogeneity on self-interactions to predict an appropriate correction function g. As a comparison, an electrical discharge causes both light and sound such that one may use lightning to predict thunder without analyzing the physics of atmospheric ionization. To determine the measured effects of inhomogeneity on self-interactions of the invention, the microcoil C is placed in a sequence of positions $P_I, \ldots, P_L$ in a representatively complex environment such as an animal brain.

For each position $P_I$, there is a rigid transformation $M_I$ (usually represented by a 4×4 matrix) such that the coil-based coordinates (X,Y,Z) may be written as $M_I(x,y,z)$ in terms of the general (x,y,z)-coordinates used in the fixed scanner system. For each position $P_I$, the invention collects both an image $v_I(x,y,z)$ (in some standard orientation of image slice) using the highest accuracy and resolution available to the external coil system in research mode (higher than the practical or permissible accuracy and resolution in clinical use), and an uncorrected image $w_I(x,y,z)$ (in the same orientation of image slice as used for the external coil) from the microcoil C using the image function $I_S$, applied to C as though spatially-varying inductance and capacitance effects were not present (thus the image function $I_S$ uses a suitable $B_\perp^C$ obtained from the vacuum equation (1) and the orientation information available for position $P_I$).

The extracted image is not a continuous function but a set of values $v_I(p_{ijk})$ at grid points $p_{ijk}=(x_o+i\delta_x, y_o+j\delta_y, z_o+k\delta_z)$ spaced by $\delta_x, \delta_y, \delta_z$ in the axis directions, for integers i, j, k in appropriate ranges, specifying a suitable volume V. By applying the above analysis, it is expected that $$v_I(x,y,z)=w_I(x,y,z)g_I(X,Y,Z)=w_I(x,y,z)g_I(M_I(x,y,z)) \qquad (6)$$

from which the correction function $g_1$ appropriate to the position $P_I$ in the specimen environment could be extracted by a simple division. This analysis, however, ignores the presence of noise, discretization error (reduction to a finite set of voxel values), re-sampling, etc. It is therefore conve nient to estimate $g_l$ by a fitting process. That is, an error measurement in the invention is defined as $$E_l(g) = \sum_{(i,j,k) \in V} e(i, j, k)(v_l(p_{ijk}) - w_l(p_{ijk})g_l(M_l(p_{ijk})))^2 \quad (7)$$

where the weights $e(i,j,k)$ are larger for points where errors are more significant; far from the microcoil C, the image $w_l$ is mostly noise and there is small use in adjusting $g_l$ to make $g_l w_l$ resemble $v_l$. A natural choice for $e(i,j,k)$ would be $B_\perp(p_{ijk})$ or its square, but other weightings may be substituted by one skilled in the art. The invention then defines $A_l = (a_{0l}, a_{1l}, a_{2l}, \ldots, a_{Nl})$ as the set of coefficients $(a_0, a_1, a_2, \ldots, a_N)$ for which $$E_l\left(\sum_{m=0}^{N} a_m g_m\right) \quad (8)$$

is smallest.

While the microcoil C is still in position $P_l$, the invention obtains data on the self-interaction of C. In the conceptually simplest version, the invention applies one or more standardized voltage variations $f_1(t), f_2(t), \ldots, f_n(t)$ such as pulses, sine waves of chosen periods, etc., across the ends of the microcoil C, or applies a magnetic pulse to C as a whole. The invention measures the resulting currents $q_1(t)$, $q_2(t), \ldots, q_n(t)$ at a sequence $t_1, t_2, \ldots, t_T$ of times after the reference time $t=0$ of the input. (Since magnetic pulsing is done as part of the imaging process, this measurement process may be combined with the normal imaging sequence.) This produces a vector $Q_1 = (q_1(t_1), q_2(t_1), \ldots, q_n(t_1), q_1(t_2), q_2(t_2) \ldots, q_n(t_2), \ldots, q_1(t_T), q_2(t_T), \ldots, q_n(t_T))$ that is influenced by the capacitance and inductance inhomogeneities around the microcoil C at position $P_l$ and that is predictive of $A_l$ to some degree. However, for a single coil it is unlikely to be sufficiently predictive: for example, if the microcoil C is symmetrical under the reflection $(x,y,z) \leftrightarrow (x,y,-z)$, then $A_l$, will be identical for two inhomogeneity patterns related by this symmetry, though they should have different (asymmetric) correction functions $g(x,y,z)$ and $g(x,y,-z)$. Thus, an aspect of the invention is to physically subdivide the microcoil C into parts $C_1, C_2, \ldots, C_K$ as further described below with respect to FIG. 1.

FIG. 1 is an illustration of an exemplary microcoil 100. The geometry of microcoil 100 is in the form of two opposing flat spirals. It should be noted, however, that a cylindrical coil, a horn-shaped coil, implantable coils and other coils may also be used. In FIG. 1, current flows along one of eight strands 110 in a first bundle 120 of positive wires, along one of connecting wires 130 connected to a corresponding strand, along one of spiral coil elements 140 connected to a corresponding connecting wire, through one of wires 150 connected to a corresponding spiral coil element, along a strand in a second bundle 111 to which the corresponding spiral coil element is connected, and to a corresponding one of eight negative terminals 116. Alternatively, the use of bundles 120 and 111 may be substituted with a single wire and controlled switches.

With a switched system, the microcoil C is switched among the parts to act as a single unit for imaging purposes, though optionally an image may be derived from an ensemble $V_1(t), V_2(t), \ldots, V_K(t)$ of voltages induced across the separate parts. For inhomogeneity assessment, the invention applies test voltage variations $f_1(t), f_2(t), \ldots, f_n(t)$ separately in turn across each of sub-coils $C_1, C_2, \ldots, C_K$, obtaining a vector $Q_l$ whose entries $q_{abj}(t_1)$ are determined by the current induced across sub-coil a at time $t_1$ from signal reference time by the voltage variation $f_j(t)$ across sub-coil b. If the input is magnetic-pulse-driven, then the invention has only entries $q_{aj}(t_1)$, with no specification for input sub-coil. In either case, the outputs of the sub-coils $C_1$, $C_2, \ldots, C_K$ are recorded separately.

The invention then seeks the best predictors $\overline{Q}(P)$ (predicted set Q, given P) and $A_S(Q)$ ($A_S$ represents the set of predicted coefficients $\{a\}$, given Q) from the sample set (which includes a variety of positions indexed by l) obtained as above with $l=1, \ldots, L$. The predictors are chosen to be "best" within a sub-class of a chosen prediction method. The predictor $A_S$ may be an artificial neural network trained on these samples, a statistical fit such as least-squared-error coefficients for a linear $A_S$, a procedure optimized by a genetic algorithm, or other known predictors in the art. Similarly, the predictor $Q(P)$ may be one of many known predictors in the art.

The predictors $\overline{Q}$ and $A_S$ are specific to the choice of fields and pulse sequence S. Accordingly, for different choices of S, one must either repeat the above testing and predictor estimation, or use a wider prediction scheme which fits a prediction of $A_S$ to a sample set of possible S.

Referring to the above estimation of $\overline{Q}$ and $A_S$ as calibration of the microcoil C for the fields and pulse sequence S, an image from a calibrated microcoil is obtained by placing the microcoil at a position P, estimating (as described earlier) its orientation M with respect to the scanner's static magnetic field, predicting a set of responses Q using predictor $\overline{Q}$, predicting a set of coefficients $\{a\}$ using the set of responses Q and predictor $A_S$, and multiplying the image resulting from $I_S$ by $$\sum_{n=0}^{N} a_n g_n(M(x, y, z)).$$

Figure 2:
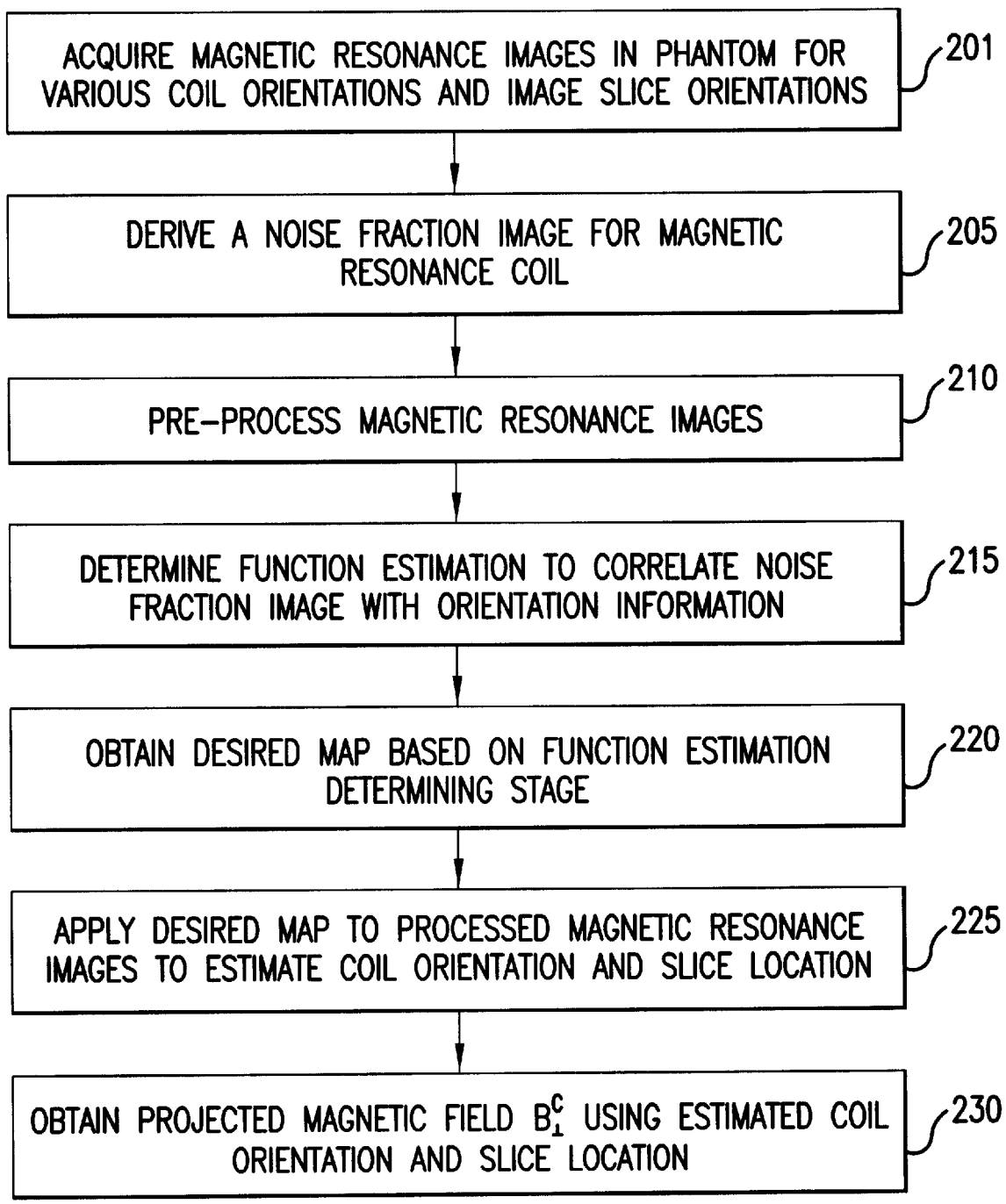
FIG. 2 is a flowchart illustrating a training and estimation of coil orientation according to an exemplary embodiment of the invention.

FIG. 2 is a flowchart illustrating a training and estimation of coil disposition with respect to the scanner, and after the training phase, to obtain the projected magnetic field $B_\perp^C$ from acquired images according to an exemplary embodiment of the invention. Magnetic resonance images are acquired at (201) in a suitable phantom material for various coil orientations and image slice orientations. Corresponding noise fraction images are then derived at (205). Next, pre-processing such as Fourier transformation, etc., is performed at (210). The pre-processed data is used together with corresponding orientation information to train a function estimation method, e.g., a neural network, at (215). A map of pre-processed noise fraction image and orientation information is obtained at (220). The map is applied to processed new data at (225) to estimate coil orientation and slice disposition. The information is then used to compute the projected magnetic field $B_\perp^C$ at (230).

Figure 3:
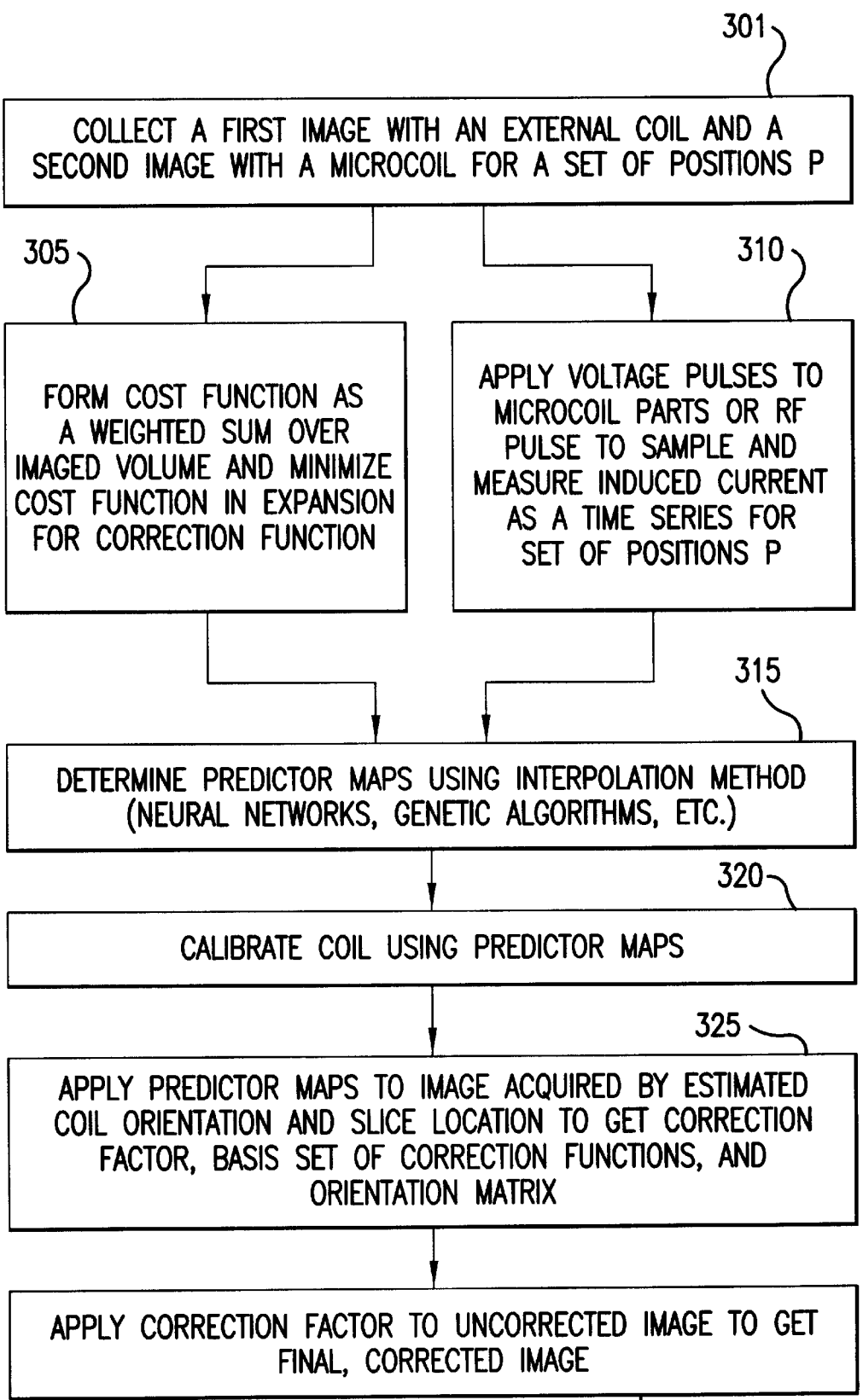
FIG. 3 is a flowchart illustrating a calibration process and its application to image correction according to an exemplary embodiment of the invention.

FIG. 3 shows a flowchart of a method for calibrating the microcoil (the training phase), followed by its application to image correction, in accordance with an embodiment of the invention. MR images w are acquired for a variety of positions $\{P\}$ with a microcoil, and corresponding images v are acquired with a high quality external coil at (301). For each of these positions, a cost function is formed and minimized at (305) to obtain an optimal set of coefficients $\{a\}$ used in expansion for correction function g. For the same set of positions, suitable voltage pulses are applied to microcoil parts, or RF pulses applied to the sample, and induced currents $\{q\}$ across each of the microcoil parts are measured at (310). A "best predictor" map $\overline{Q}$ between the set of positions {P} and the set of currents {q}, and a best predictor map $A_S$ between the set of currents {q} and the set of coefficients {a}, are found at (315) by using any of a variety of methods known or foreseeable to one of ordinary skill in the art of function estimation, such as neural networks, genetic algorithms, and various interpolation methods, etc. These maps serve to calibrate the coil at (320). Given a magnetic resonance image acquired with the microcoil characterized by M, the correction factor g is determined everywhere by applying maps $\overline{Q}$ and $A_S$, coefficients {a}, a basis set of correction functions, and orientation matrix M at (325). Finally, the correction factor g is applied (330) to the extracted, uncorrected image to get the final, corrected image.

The specification describes representative examples of several elements of a preferred embodiment of the invention. They should not be construed so as to restrict the subject matter of the invention herein disclosed.

What is claimed is:

1. A system for calibrating a movable receiver coil with spatially varying signal reception profile operating in a magnetic resonance imaging environment, the system comprising:

an electro-mechanical device for detecting electromagnetic interactions between different parts of the movable receiver coil with spatially varying signal reception profile; and an electronic device, operationally coupled to said electro-mechanical device, for correlating the electromagnetic interactions between the different parts of the movable receiver coil with spatially varying signal reception profile with acquired magnetic resonance images in various tissue environments and constructing a cost function using associated correlated electromagnetic interactions data and records and a correction function in each tissue environment.

2. A method for calibrating a movable receiver coil with spatially varying signal reception profile in a dielectric environment, comprising:

dividing the movable receiver coil with spatially varying signal reception profile into a plurality of parts;

determining electromagnetic interactions of said plurality of parts in the dielectric environment;

correlating the electromagnetic interactions of said plurality of parts;

associating the correlated electromagnetic interactions data with records including responses of the movable receiver coil with spatially varying signal reception profile in various tissue environments; and constructing a cost function using said associated correlated electromagnetic interactions data and records and a correction function in each tissue environment.

3. A method of claim 2, further comprising associating the correlated electromagnetic interactions data with records including at least one of (1) responses of the movable receiver coil with spatially varying signal reception profile in various tissue environments to emissions caused by stimuli from external magnetic resonance coils, (2) high-resolution external movable receiver coil with spatially varying signal reception profile records of emissions from same environments, and (3) measures of self-interactions and mutual interactions among the parts of the movable receiver coil with spatially varying signal reception profile.

4. A method of claim 3, wherein said measures of self-interactions and mutual interactions among the parts include records of currents flowing in the parts when each of the parts is exposed to a predetermined voltage pulse.

5. A method of claim 2, wherein said measures of self-interactions and mutual interactions among the parts include records of currents flowing in the parts when a whole of the movable receiver coil with spatially varying signal reception profile is exposed to one or more predetermined magnetic pulses.

6. A method of claim 3, further comprising combining said associated correlated electromagnetic interactions data and records with said cost function to train an automated system to associate any set of correlated electromagnetic interactions data and records with a scheme of modifications to functions constructed by the movable receiver coil with spatially varying signal reception profile so as to minimize said cost function.

7. A method of claim 6, wherein said automated system is an artificial neural network.

8. A method of claim 7, wherein said artificial neural network includes an architecture reflecting a spatial locality of a problem, and wherein for any point, only coefficients of basis functions that have not vanished at that point are candidates that are influenced by intensities associated with that point.

9. A method of claim 6, wherein said modifications include spatially-varying functions that are added to a spatially-varying multiplier so as to convert constructed image intensities to attributed image activities.

10. A method of claim 9, wherein said spatially-varying functions are chosen from a finite-dimensional space of polynomial functions defined on a three-dimensional space around the movable receiver coil with spatially varying signal reception profile.

11. A method of claim 9, wherein said spatially-varying functions are chosen from a finite-dimensional space of wavelets defined on a three-dimensional space around the movable receiver coil with spatially varying signal reception profile.

12. A method of claim 9, wherein said spatially-varying functions are chosen from a finite dimensional space of products of spherical harmonics by polynomials in the radius.

13. A method of claim 9, wherein said spatially-varying functions are chosen from a finite-dimensional space of products of trigonometric polynomials in an angle around a cylindrical coordinate system and polynomials in radial and lengthwise coordinates.

14. A method of claim 6, wherein said automated system performs a genetic algorithm.

15. A method of claim 6, wherein said automated system performs a statistical least-squares fit computation.

16. A method of claim 3, wherein said cost function is constructed from a weighted sum of two or more quantities.

17. A method of claim 2, wherein the parts of the movable receiver coil with spatially varying signal reception profile are connected in parallel.

18. A method of claim 2, wherein the parts of the movable receiver coil with spatially varying signal reception profile are connected in series.

19. A method of claim 2, wherein the movable receiver coil with spatially varying signal reception profile captures a set of magnetic resonance images of the dielectric environment.

20. A function estimating method for determining position and orientation data of an arbitrary magnetic resonance image captured from a movable receiver coil with spatially varying signal reception profile, comprising:

acquiring a set of processed or unprocessed magnetic resonance images from the movable receiver coil with spatially varying signal reception profile;

applying a set of predetermined position and orientation records corresponding with said set of processed or unprocessed magnetic resonance images;

determining a functional map to predict position and orientation data associated with an arbitrary magnetic resonance image;

associating correlated electromagnetic interactions data with records including responses of the movable receiver coil with spatially varying signal reception profile in various tissue environments; and constructing a cost function using the associated correlated electromagnetic interactions data and records and a correction function in each tissue environment.

21. A method of claim 20, wherein said movable receiver coil with spatially varying signal reception profile comprises parts connected in parallel.

22. A method of claim 20, wherein said movable receiver coil with spatially varying signal reception profile comprises parts connected in series.

23. A method of claim 20, wherein the steps of the method are performed by an artificial neural network.

24. A method of claim 20, further comprising performing a genetic computation to determine the functional map to predict the position and orientation data associated with the arbitrary magnetic resonance image.

25. A method of claim 20, further comprising performing a statistical least-squares fit computation to determine the functional map to predict the position and orientation data associated with the arbitrary magnetic resonance image.

* * * * *